United States Patent
Dake et al.

(10) Patent No.: US 11,569,808 B2
(45) Date of Patent: Jan. 31, 2023

(54) WIDE HIGH VOLTAGE SWING INPUT COMPARATOR STAGE WITH MATCHING OVERDRIVE

(71) Applicant: TEXAS INSTRUMENTS INCORPORATED, Dallas, TX (US)

(72) Inventors: Tuli Luthuli Dake, Plano, TX (US); Satish Kumar Vemuri, Raleigh, NC (US); Ritesh Jitendra Oza, Plano, TX (US); Laszlo Balogh, Merrimack, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/515,077

(22) Filed: Oct. 29, 2021

(65) Prior Publication Data
US 2022/0140823 A1 May 5, 2022

Related U.S. Application Data

(60) Provisional application No. 63/108,729, filed on Nov. 2, 2020.

(51) Int. Cl.
*H03K 5/00* (2006.01)
*H03K 5/24* (2006.01)
*H03K 19/003* (2006.01)
*H03K 17/08* (2006.01)

(52) U.S. Cl.
CPC ........... *H03K 5/2481* (2013.01); *H03K 17/08* (2013.01); *H03K 19/00384* (2013.01)

(58) Field of Classification Search
None
See application file for complete search history.

(56) References Cited

U.S. PATENT DOCUMENTS

| | | | | |
|---|---|---|---|---|
| 5,376,819 | A * | 12/1994 | Gay | ........................ H01L 23/34 257/776 |
| 6,714,595 | B1 * | 3/2004 | So | ........................ H04L 25/0272 375/257 |
| 7,880,400 | B2 | 2/2011 | Zhou et al. | |
| 8,970,260 | B1 | 3/2015 | de Haas | |

(Continued)

OTHER PUBLICATIONS

Search Report for PCT Patent Application No. PCT/US2021/057635 international search report dated Jan. 20, 2022, 1 page.

*Primary Examiner* — Tuan T Lam
(74) *Attorney, Agent, or Firm* — Ray A. King; Frank D. Cimino

(57) ABSTRACT

An apparatus includes a differential input pair, a first resistor, a second resistor, and a comparator. The differential input pair having first and second differential inputs. The first differential input is adapted to be coupled to an output of a controller and the second differential input is adapted to be coupled to a signal ground of the controller. The first resistor is adapted to be coupled to a third resistor via the first differential input to form a first voltage divider. The second resistor is adapted to be coupled to a fourth resistor via the second differential input to form a second voltage divider. The comparator having first and second comparator inputs. The first comparator input is coupled between the first resistor and the first differential input. The second comparator input is coupled between the second resistor and the second differential input.

17 Claims, 7 Drawing Sheets

(56) References Cited

U.S. PATENT DOCUMENTS

| | | | |
|---|---|---|---|
| 9,231,590 B1 | 1/2016 | Schie et al. | |
| 9,659,924 B2 * | 5/2017 | Li | H01L 27/0266 |
| 9,793,709 B2 | 10/2017 | Smith et al. | |
| 2004/0021999 A1 * | 2/2004 | Yamaguchi | H01L 27/0255 |
| | | | 361/56 |
| 2005/0017796 A1 * | 1/2005 | Tanizawa | H03F 1/523 |
| | | | 327/562 |
| 2008/0238392 A1 | 10/2008 | Cheung et al. | |
| 2021/0048457 A1 * | 2/2021 | Ishida | H03K 5/2481 |
| 2022/0085798 A1 * | 3/2022 | Akahane | H03K 5/2481 |

* cited by examiner

WIDE HIGH VOLTAGE SWING INPUT COMPARATOR STAGE WITH MATCHING OVERDRIVE

CROSS-REFERENCE TO RELATED APPLICATIONS

The present application claims priority to U.S. Provisional Patent Application No. 63/108,729, which was filed Nov. 2, 2020, is titled "Wide High Voltage Swing Input Comparator Stage With Matching Overdrive," and is hereby incorporated herein by reference in its entirety.

BACKGROUND

A driver is a circuit, component, or device that provides an output for modifying operation of a load based on an input received from a controller. The received input can be referenced to a signal ground (SGND) of the controller. An operational state of the driver can be set by evaluating the received input with respect to a device ground (GND) of the driver. The driver can provide the output for modifying operation of the load based on the operational state.

Voltage differences such as ground bounce can exist between the SGND and the GND. The received input can include signal noise or other variation in value associated with such SGND-to-GND voltage differences. This signal noise or other variation in value may negatively impact evaluation of the received input that may increase a likelihood of erratic or abnormal output behavior by the driver. A common mode range (CMR) of the driver may describe a range of SGND-to-GND voltage differences over which received inputs may be reliably evaluated to decrease a likelihood of erratic or abnormal output behavior by the driver.

SUMMARY

In accordance with at least one example of the description, an apparatus includes a differential input pair, a first resistor, a second resistor, and a comparator. The differential input pair having a first differential input and a second differential input. The first differential input is adapted to be coupled to an output of a controller and the second differential input is adapted to be coupled to a signal ground of the controller. The first resistor is adapted to be coupled to a third resistor via the first differential input to form a first voltage divider. The second resistor is adapted to be coupled to a fourth resistor via the second differential input to form a second voltage divider. The comparator having a first comparator input and a second comparator input. The first comparator input is coupled between the first resistor and the first differential input. The second comparator input is coupled between the second resistor and the second differential input.

DETAILED DESCRIPTION

Figure 1:
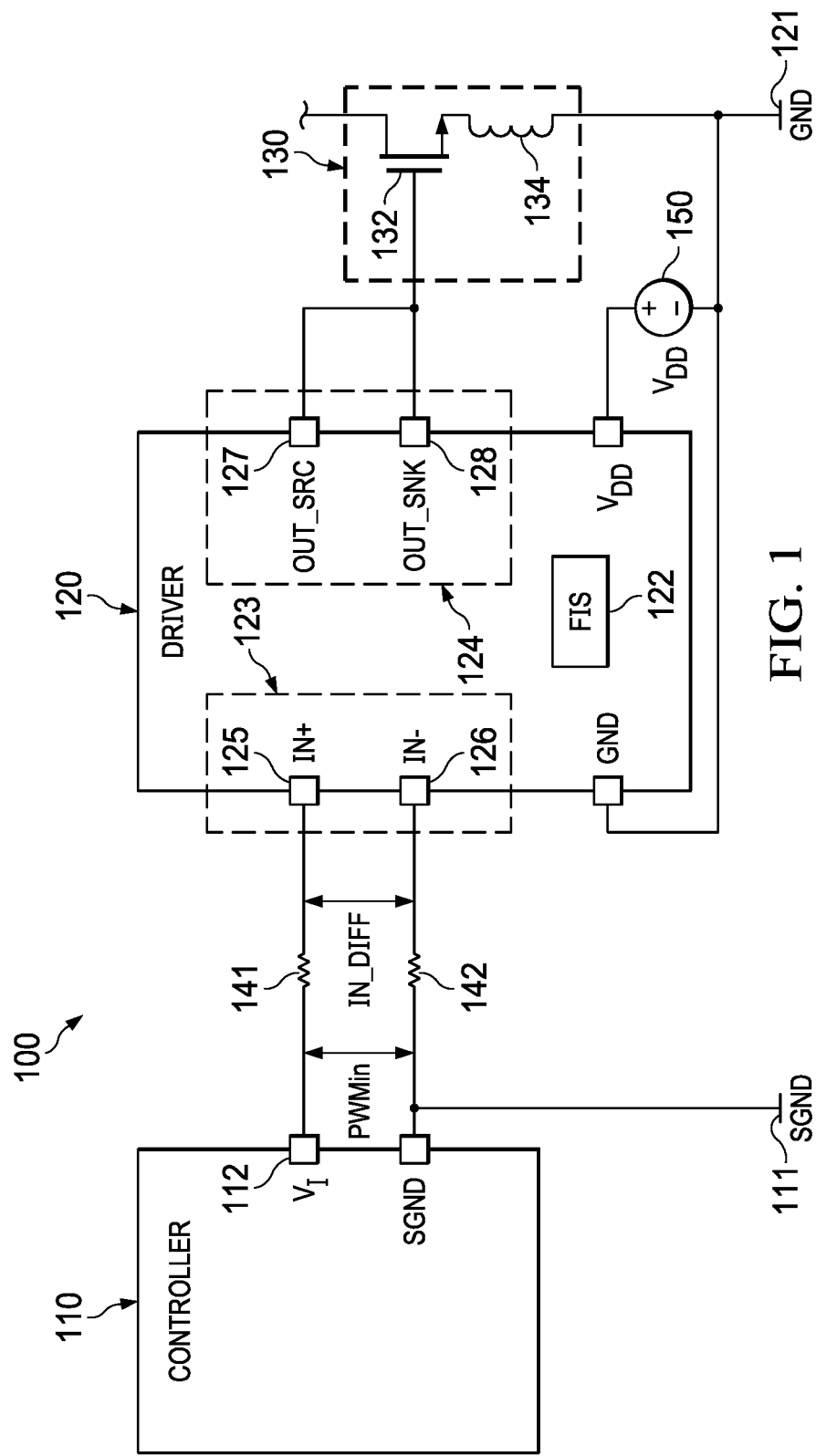
FIG. 1 is a block diagram of an example system for driving a transistor load.

It may be advantageous to expand a common mode range (CMR) of a driver to accommodate for large voltage differences between a signal ground (SGND) of a controller and a device ground (GND) of the driver. Expanding a CMR of a driver may enable the driver to be suitable for implementation in multiple applications that generally experience SGND-to-GND voltage differences, such as applications with insulated-gate bipolar transistor (IGBT), silicon carbide (SiC), or metal-oxide-semiconductor field-effect transistor (MOSFET) gate drives or high parasitic elements. Some existing driver topologies may expand a CMR of a driver with a voltage divider pair that is useful to create a stepped down common mode voltage to differentially sense an input signal received from a controller. Negative voltages may appear on an input of a driver implementing such driver topologies as the voltage divider pair may include a voltage divider coupled between SGND and GND. Thus, such driver topologies may implement bi-directional electrostatic discharge (ESD) structures to mitigate negative impacts associated with negative voltages appearing on the input of the driver. Also, filtering elements, such as resistor-capacitor (RC) filters and second-order filters are implemented by such driver topologies to reduce high-frequency common-mode noise introduced by any divider ratio asymmetry in the voltage divider pair. To maintain reduced input-to-output propagation delays associated with the filtering elements, such driver topologies may implement on-chip trimming. The various elements that such driver topologies implement to expand a CMR of a driver increase circuit complexity and reduce signal path speed.

Aspects of this description relate to a driver having a wide CMR. For example, at least one implementation of a driver according to this description provides for a CMR that can accommodate SGND-to-GND voltage differences of greater than +/−100 volts. At least one example of a driver includes a floating input stage (FIS). The FIS may provide a direct current (DC) voltage offset with respect to GND to facilitate decoupling a differential input pair of the driver from GND. That DC voltage offset may facilitate expanding a CMR of the driver and/or reducing a potential of negative voltage appearing on the differential input pair. Reducing a potential of negative voltage appearing on the differential input pair mitigates negative impacts of such negative voltage without bi-directional ESD structures. The FIS may evaluate an input signal provided by a controller with a voltage reference ($V_{REF}$) set based on a differential voltage appearing on the differential input pair to facilitate dynamically adjusting $V_{REF}$ in a manner that tracks voltage variations in the input signal. Dynamically adjusting $V_{REF}$ in a manner that tracks voltage variations in the input signal mitigates pulse width distortion in a state signal that can maintain reduced input-to-output propagation delays without implementing on-chip trimming. Mitigating negative impacts of negative voltage appearing on the differential input pair without bi-directional ESD structures and/or maintaining reduced input-to-output propagation delays without implementing on-chip trimming can reduce a component count of a driver. Reducing a component count of a driver can reduce circuit complexity and/or increase signal path speed.

FIG. 1 is a block diagram of an example system 100. At least some implementations of the system 100 are representative of an application environment for a driver including an FIS, as described above. In at least some examples, the system 100 includes a controller 110, a driver 120 that includes an FIS 122, and a load 130 that includes a transistor or other switching device, such as a field-effect transistor (FET) 132, a MOSFET, or a bipolar junction transistor (BJT). The driver 120 may be adapted to be coupled between the controller 110 and the load 130. The driver 120 may be configured to provide an output that modifies operation of the load 130 based on a pulse width modulation input signal (PWMin) provided by the controller 110.

In an example architecture of the system 100, the driver 120 has a differential input pair 123 and an output pair 124. The differential input pair 123 includes a first differential input (IN+) 125 and a second differential input (IN−) 126. IN+ 125 is adapted to be coupled to an output 112 of the controller 110 and configured to receive a scaled representation of an input voltage ($V_1$) of PWMin that is scaled, at least, partially according to a resistance value of a first input resistor ($Rint_1$) 141. IN− 126 is adapted to be coupled to a SGND 111 of the controller 110 and configured to receive a scaled representation of a voltage ($V_{SGND}$) present on SGND 111 that is scaled, at least, partially according to a resistance value of a second input resistor ($Rint_2$) 142. In at least one example, IN+ 125 and IN− 126 are positive or non-inverting and negative or inverting inputs, respectively, of the differential input pair 123. The output pair 124 includes a source output (OUT_SRC) 127 and a sink output (OUT_SNK) 128. OUT_SRC 127 and OUT_SNK 128 are adapted to be coupled to a gate of FET 132. The OUT_SRC 127 is adapted to be coupled to the gate of FET 132 with a positive supply voltage ($V_{DD}$) 150 responsive to an operational state of the driver 120 being set to an "enable" state. The OUT_SNK 128 is adapted to be coupled to the gate of FET 132 with the GND 121 responsive to the operational state of the driver 120 being set to a "disable" state.

In an example operation of system 100, a differential signal (IN_DIFF) that is proportional to PWMin is received at the differential input pair 123. FIS 122 evaluates IN_DIFF with respect to a reference voltage ($V_{REF}$) to provide a state signal (PWMout) that sets an operational state of the driver 120. In some examples, PWMout may set the operational state of the driver 120 to a first state (e.g., an "enable" state) responsive to IN_DIFF being greater in value than $V_{REF}$. Similarly, PWMout may set the operational state of the driver 120 to a second state (e.g., a "disable" state) responsive to IN_DIFF being less in value than $V_{REF}$. Responsive to PWMout setting the operational state to the "enable" state, the driver 120 activates OUT_SRC 127 to provide a sourcing current to the gate of FET 132 to modify operation of the FET 132. Responsive to PWMout setting the operational state to the "disable" state, the driver 120 activates OUT_SNK 128 to provide a sinking current to the gate of FET 132 to modify operation of the FET 132.

In at least some examples, voltage differences (SGND-to-GND voltage differences) such as ground bounce may exist between the SGND 111 and the GND 121 (e.g., a voltage ($V_{GND}$) present on GND 121>$V_{SGND}$ or $V_{GND}$<$V_{SGND}$). The voltage differences may be associated with parasitic elements of the system 100 such as a parasitic impedance 134 associated with the load 130. PWMin and/or IN_DIFF can include signal noise or other variation in value associated with SGND-to-GND voltage differences. This signal noise or other variation in value of PWMin and/or IN_DIFF may negatively impact evaluation of IN_DIFF by FIS 122, which may increase a likelihood of erratic or abnormal output behavior by the driver 120. This signal noise or other variation in value of PWMin and/or IN_DIFF may also cause a voltage ($V_{IN+}$) present on IN+ 125 and/or a voltage ($V_{IN−}$) present on IN− 126 to exceed operational limits (e.g., upper and/or lower voltage limits) associated with one or more components of driver 120. To at least partially mitigate misevaluating IN_DIFF due to signal noise or other variation in value associated with SGND-to-GND voltage differences, FIS 122 may set $V_{REF}$ based on a voltage of IN_DIFF ($V_{IN\_DIFF}$) to facilitate dynamically adjusting $V_{REF}$ in a manner that tracks voltage variations in PWMin. To at least partially mitigate exceeding the operational limits associated with one or more components of the driver 120 due to signal noise or other variation in value associated with SGND-to-GND voltage differences, FIS 122 may provide a direct current (DC) voltage offset with respect to $V_{GND}$ to facilitate decoupling the differential input pair 123 from GND 121.

Figure 2:
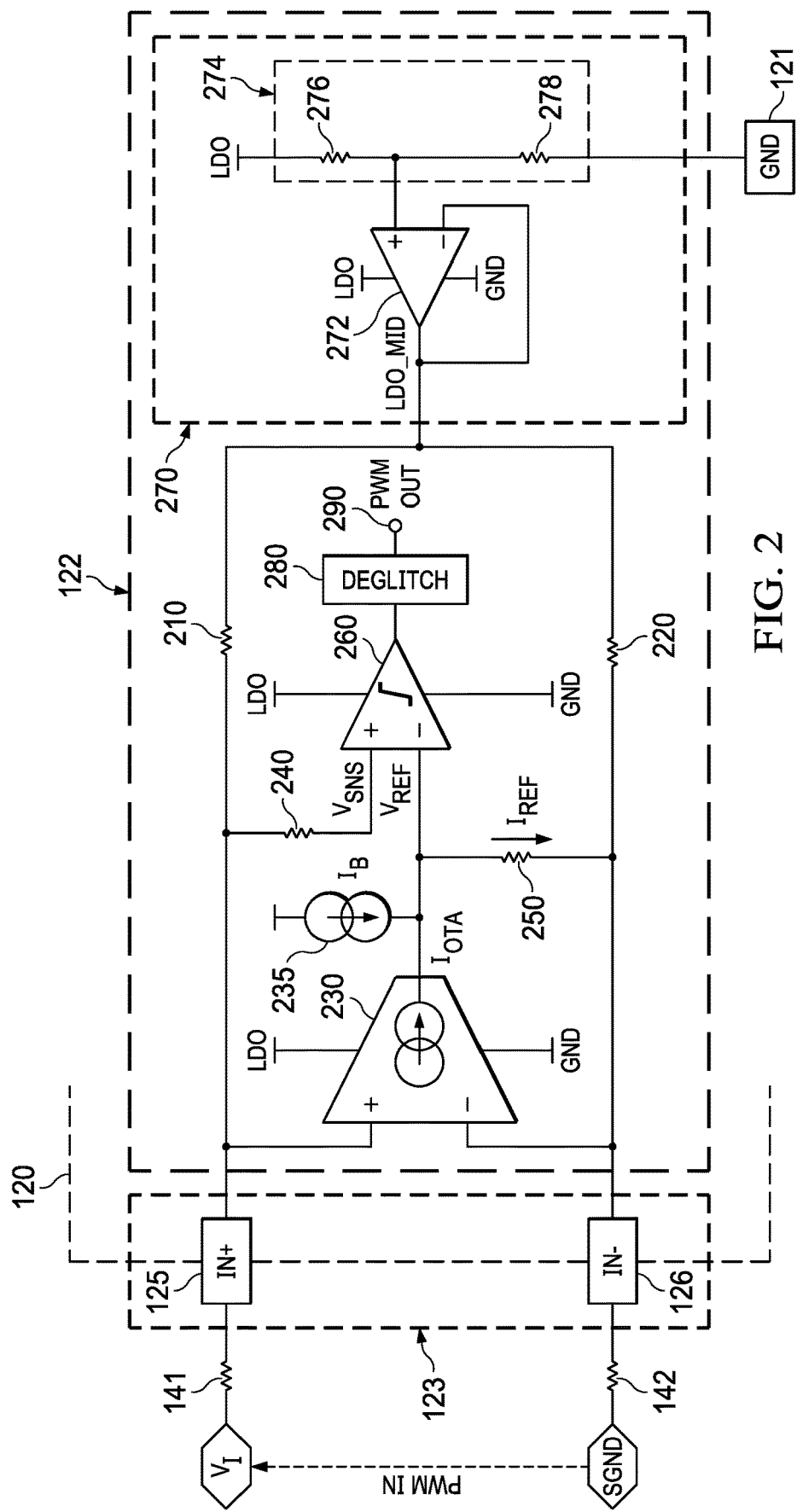
FIG. 2 is a schematic diagram of an example implementation of an input portion of the driver.

FIG. 2 is a schematic diagram of an example implementation of a portion of the driver 120. In at least some examples, FIG. 2 is representative of a component-level implementation of, at least, a portion of the driver 120 as shown in FIG. 1. For example, the driver 120 as shown in FIG. 2 includes the differential input pair 123 and the FIS 122. In at least some examples, the FIS 122 includes a first divider resistor ($Rin_1$) 210, a second divider resistor ($Rin_2$) 220, an operational transconductance amplifier (OTA) 230, a sense resistor 240, a reference resistor 250, a comparator 260, a ground offset circuit 270, a deglitch circuit 280 and a state output 290. In at least one example, $Rin_1$ 210 and $Rin_2$ 220 have approximately identical resistance values. In at least some examples, the FIS 122 is adapted to be coupled to one or more components at the differential input pair 123, such as $Rint_1$ 141 and $Rint_2$ 142. The ground offset circuit 270 includes an amplifier 272 and a voltage divider 274 that includes a first bias resistor ($Rb_1$) 276 coupled to a supply voltage (LDO) and a second bias resistor ($Rb_2$) 278 adapted to be coupled to the GND 121. The ground offset circuit 270 is configured to provide a voltage offset (LDO_MID) at the output of the amplifier 272 that corresponds to a DC voltage offset with respect to $V_{GND}$. Responsive to symmetry existing between $Rb_1$ 276 and $Rb_2$ 278 (e.g., the respective resistance values of $Rb_1$ 276 and $Rb_2$ 278 are approximately identical), LDO_MID may be determined according to $V_{GND}$+(LDO/2).

In an example architecture of the driver 120, $Rin_1$ 210 has a first terminal adapted to be coupled to $Rint_1$ 141 via IN+ 125 to form a first voltage divider and a second terminal coupled to an output of the amplifier 272. The first voltage divider that includes $Rin_1$ 210 is adapted to be coupled between LDO_MID and a controller output (e.g., controller output 112). $Rin_2$ 220 has a first terminal adapted to be coupled to $Rint_2$ 142 via IN− 126 to form a second voltage divider and a second terminal coupled to the output of the amplifier 272. The second voltage divider that includes $Rin_2$ 220 is adapted to be coupled between LDO_MID and a SGND (e.g., SGND 111) of a controller. In some examples, the first and second voltage dividers can form a voltage divider network that is configured to provide a differential signal (e.g., IN_DIFF) based on an input signal (e.g., PWMin). The OTA 230 has an OTA output coupled to a second comparator input (e.g., a negative or inverting input) of the comparator 260 and an OTA input pair that includes a first OTA input (e.g., a positive or non-inverting input)

coupled to IN+ 125 and a second OTA input (e.g., a negative or inverting input) coupled to IN– 126. The sense resistor 240 includes a first terminal coupled the first terminal of $Rin_1$ 210 and a second terminal coupled to a first comparator input (e.g., a positive or non-inverting input) of the comparator 260. The reference resistor 250 includes a first terminal coupled to the OTA output of OTA 230 and a second terminal coupled to IN– 126. The amplifier 272 includes a first input (e.g., a positive or non-inverting input) coupled between $Rb_1$ 276 and $Rb_2$ 278 and a second input (e.g., a negative or inverting input) coupled to the output of the amplifier 272. The deglitch circuit 280 is coupled between a comparator output of the comparator 260 and the state output 290.

In an example operation of the driver 120, IN_DIFF is provided at the differential input pair 123. The first OTA input of the OTA 230 and the sense resistor 240, responsive to IN_DIFF being provided at the differential input pair 123, are configured to receive $V_{IN+}$ from IN+ 125. The second OTA input of the OTA 230, responsive to IN_DIFF being provided at the differential input pair 123, is configured to receive $V_{IN-}$ from IN– 126. $V_{IN+}$ with respect to LDO_MID may be determined according to $RR_1*(PWMin-LDO\_MID)$, where $RR_1$ is a first divider ratio of the first voltage divider that includes $Rin_1$ 210. $V_{IN-}$ with respect to LDO_MID may be determined according to $RR_2*(LDO\_MID)$, responsive to $V_{SGND}$ being 0 volts and where $RR_2$ is a second divider ratio of the second voltage divider that includes $Rin_2$ 220. $RR_1$ and/or $RR_2$ may be determined according to $RR_n$=a resistance value of $Rint_n$/(a resistance value of $Rin_n$+the resistance value of $Rint_n$), where n is an integer value. Responsive to symmetry existing between $RR_1$ and $RR_2$ (e.g., the respective values of $RR_1$ and $RR_2$ are approximately identical), $V_{IN\_DIFF}$ is independent of $V_{GND}$ such that $V_{IN\_DIFF}$, may be determined according to $V_{IN+}-V_{IN-}$ or $RR*PWMin$, where RR is a value of $RR_1 \sim RR_2$. Responsive to asymmetry existing between a resistance value associated with $RR_1$ and a resistance value associated with $RR_2$ (e.g., the respective resistance values of $Rint_1$ 141 and $Rint_2$ 142 are dissimilar and/or the respective resistance values of $Rin_1$ 210 and $Rin_2$ 220 are dissimilar) dependency may exist between $V_{IN\_DIFF}$ and $V_{GND}$ such that $V_{IN\_DIFF}$ may be determined according to $(RR*PWMin)+(\Delta RR*RR*V_{GND})$, where $\Delta RR$ is a resistor mismatch factor. In at least one example, $\Delta RR$ represents a collective mismatch that includes a mismatch between $Rint_1$ 141 and $Rint_2$ 142 combined with a mismatch between $Rin_1$ 210 and $Rin_2$ 220. The sense resistor 240 is configured to provide a sense voltage ($V_{SNS}$) to the first comparator input of the comparator 260 based on $V_{IN+}$. The OTA output of the OTA 230 is configured to provide an OTA adaptive current ($I_{OTA}$) responsive to the first and second OTA inputs of the OTA 230 receiving $V_{IN+}$ and $V_{IN-}$. A combination of $I_{OTA}$ and a bias current ($I_B$) provided by a current source 235 can form a reference current ($I_{REF}$). $I_{REF}$ may be determined according to $(V_{IN+}-V_{IN-})*G_M+I_B$, where $G_M$ is a gain associated with OTA 230. The reference resistor 250 is configured to provide $V_{REF}$ to the second comparator input of the comparator 260 based on $I_{REF}$. By dynamically adjusting $V_{REF}$ in a manner that tracks voltage variations in $V_{IN\_DIFF}$, OTA 230 can facilitate reducing input-to-output propagation delays between the differential input pair 123 and the state output 290. In some examples, $V_{REF}$ is approximately $V_{IN\_DIFF}/2$. A voltage difference between $V_{SNS}$ and $V_{REF}$ (e.g., $V_{SNS}-V_{REF}$) can form an overdrive signal for input to the comparator 260. The comparator output of the comparator 260 is configured to provide PWMout to an input of the deglitch circuit 280 based on the overdrive signal. The deglitch circuit 280 is configured to reduce or filter spurious signals within PWMout and provide a filtered PWMout to the state output 290. The deglitch circuit 280 is implemented according to any suitable architecture, the scope of which is not limited herein. The state output 290 is adapted to be coupled to a logic circuit (not shown) of driver 120 that is configured to set an operational state of the driver 120 responsive to the filtered PWMout.

In some examples, a lower value limit of $1/RR_1$ or $1/RR_2$ may be based on an input CMR of the comparator 260 and/or a supply voltage and undervoltage lockout (UVLO) threshold of the driver 120. In some examples, an upper value limit of $1/RR_1$ or $1/RR_2$ may be based on an offset of the comparator 260, an offset of the OTA 230, an inverse value of a resistor mismatch factor ($1/\Delta RR$), and/or a minimum voltage for the overdrive signal to facilitate propagation delay matching. In some examples, a trade off may exist between a range of SGND-to-GND voltage differences that the driver 120 can accommodate and $V_{IN\_DIFF}$ in as much as each are impacted differently by RR. For example, $RR_n$ may be approximately 1/60 responsive to $Rin_n$ having a resistance value of 30 kiloohms (kΩ) and $Rint_n$ has a resistance value of 0.5 kΩ Responsive to $RR_n$ being 1/60, $V_{IN\_DIFF}$ may be about 50 millivolts (mV) for applications in which PWMin is 3 volts. In this example, OTA 230 may set $V_{REF}$ to 25 mV thereby providing an ideal $V_{SNS}-V_{REF}$ rise and fall overdrive of 25 mV. Some aspects that may negatively impact the ideal $V_{SNS}-V_{REF}$ rise and fall overdrive include an offset of the comparator 260, an offset of the OTA 230, and/or a resistor mismatch factor. If a maximum SGND-to-GND voltage difference is less than (UVLO/2)/$RR_n$, the maximum SGND-to-GND voltage difference in this example is about 100 volts responsive to UVLO being 3.4 volts. Responsive to $RR_n$ being changed from 1/60 to 1/120 for increasing the maximum SGND-to-GND voltage difference to 200 volts, the ideal $V_{SNS}-V_{REF}$ rise and fall overdrive value decreases from 25 mV to 12.5 mV. Responsive to accounting for the aspects (e.g., offset of the comparator 260, the offset of the OTA 230, and/or the resistor mismatch factor) that may negatively impact the ideal $V_{SNS}-V_{REF}$ rise and fall overdrive, the driver 120 may be unable to accommodate a $V_{SNS}-V_{REF}$ rise and fall overdrive of 12.5 mV.

Figure 3:
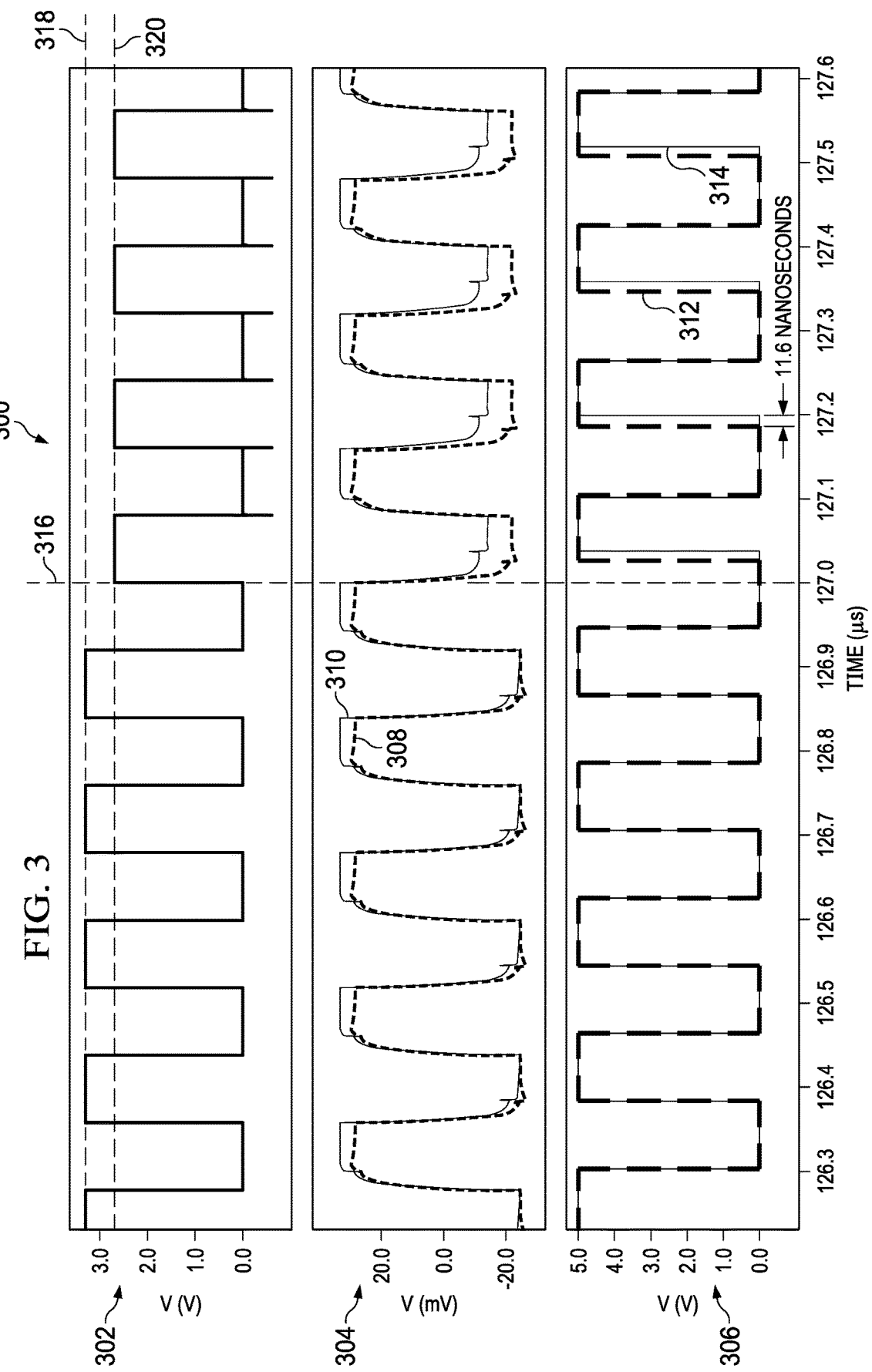
FIG. 3 is a diagram of example signal waveforms showing voltage as a function of time.

FIG. 3 is a diagram 300 of example signal waveforms that show a comparison between responses to PWMin variations by the driver 120 that includes the FIS 122 and a driver that does not include an FIS 122. The diagram 300 includes plots 302, 304 and 306. Plot 302 represents PWMin voltage as a function of time provided by the controller 110. Plot 304 represents overdrive signal (e.g., $V_{SNS}-V_{REF}$) voltage as a function of time. Waveforms 308 and 310 of plot 304 correspond to overdrive signal voltages provided by the driver 120 that includes the FIS 122 and the driver that does not include an FIS 122, respectively. Plot 306 represents PWMout voltage as a function of time. Waveforms 312 and 314 of plot 306 correspond to PWMout voltages provided by the driver 120 that includes the FIS 122 and the driver that does not include an FIS 122, respectively. Prior to time 316, the controller 110 provides PWMin at a first voltage level 318 (e.g., 3.3 V). At time 316, the controller 110 provides PWMin at a second voltage level 320 (e.g., 2.7 V) that is less than the first voltage level 318. Plot 304 shows that the FIS 122 reduces an effect of that PWMin variation on the overdrive signal of the driver 120. Plot 306 shows that the FIS 122 further reduces pulse width distortion in PWMout of the driver 120 by reducing the effect of that PWMin variation on the overdrive signal of the driver 120. For example, the waveform 312 corresponding to the driver 120 with the FIS 122 includes about 11.6 nanoseconds less pulse width distortion after time 316 than the waveform 314 corresponding to the driver without a FIS 122. As shown in the diagram 300, the FIS 122 provides the driver 120 with improved overdrive signal and PWMout stability responsive to PWMin volatility (e.g., variations in voltage from the first voltage level 318 to the second voltage level 320) in comparison to a driver that does not include the FIS 122.

Figure 4:
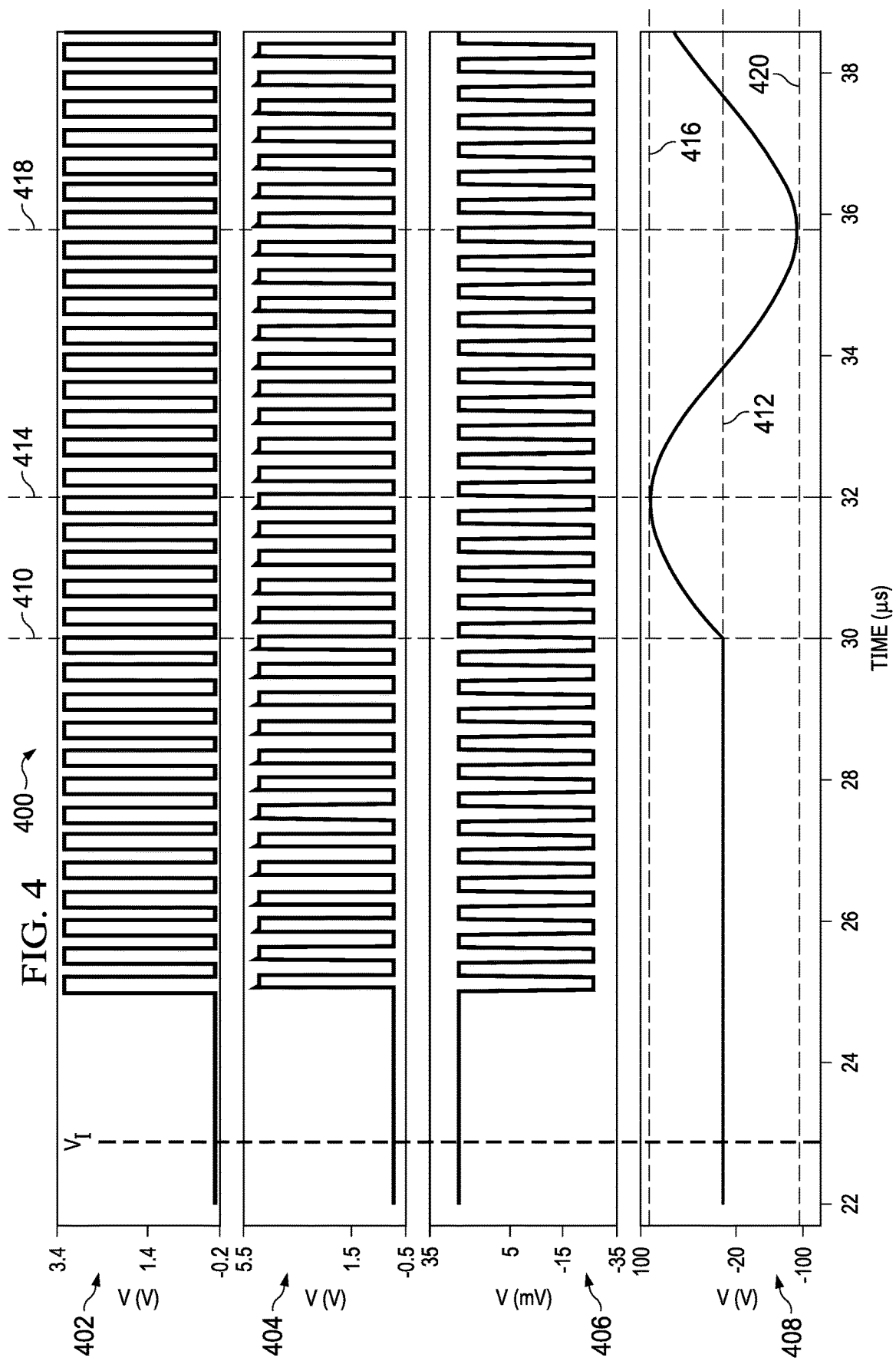
FIG. 4 is a diagram of example simulated signal waveforms showing voltage as a function of time.

FIG. 4 is a diagram 400 of example signal waveforms that show a response to ground shift or voltage swings between SGND 111 and GND 121 by the driver 120 that includes the FIS 122. The diagram 400 includes plots 402, 404, 406, and 408. Plot 402 represents PWMin voltage as a function of time provided by the controller 110. Plot 404 represents PWMout voltage as a function of time. Plot 406 represents overdrive signal (e.g., $V_{SNS}-V_{REF}$) voltage as a function of time. Plot 408 represents a voltage difference between SGND 111 and GND 121 as a function of time. Prior to time 410, the voltage difference between SGND 111 and GND 121 remains substantially consistent at a first voltage level 412 (e.g., 0 volts DC). Between time 410 and time 414, the voltage difference between SGND 111 and GND 121 increases from the first voltage level 412 to a second voltage level 416 (e.g., +100 volts DC). Between time 414 and time 418, the voltage difference between SGND 111 and GND 121 decreases from the second voltage level 416 to a third voltage level 420 (e.g., −100 volts DC). As shown in the diagram 400, the FIS 122 provides the driver 120 with an improved response to ground shift in as much as the overdrive signal and PWMout continue to track PWMin, as the voltage difference between SGND 111 and GND 121 swings between the second voltage level 416 and the third voltage level 420.

Figure 5:
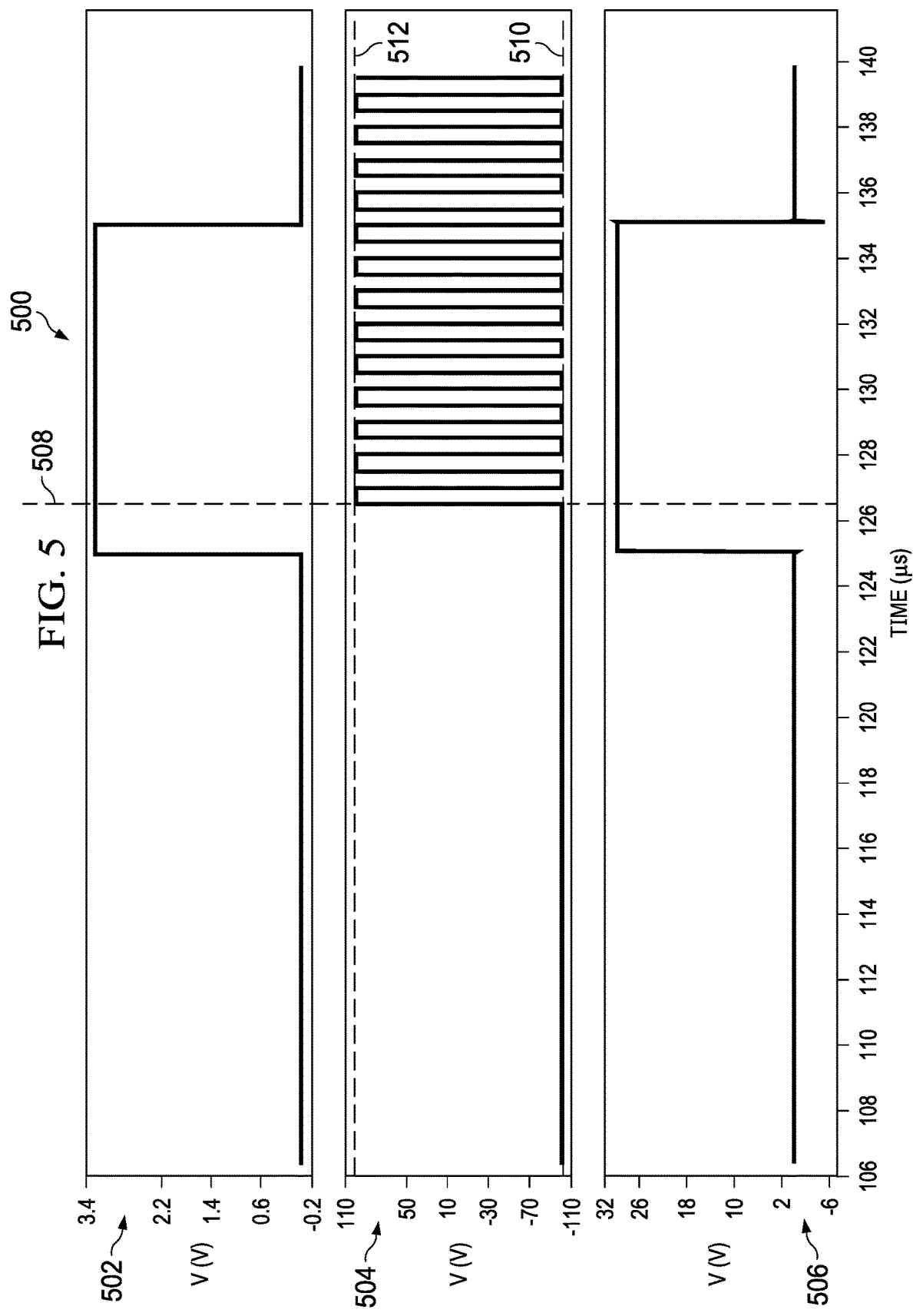
FIG. 5 is a diagram of example simulated signal waveforms showing voltage as a function of time.

FIG. 5 is a diagram 500 of example signal waveforms that show a common mode transient immunity (CMTI) response to transient ground bounce between SGND 111 and GND 121 by the driver 120 that includes the FIS 122. The diagram 500 includes plots 502, 504, and 506. Plot 502 represents PWMin voltage as a function of time provided by the controller 110. Plot 504 represents a sharp transient voltage difference (e.g., approximately 200V/nanosecond) between SGND 111 and GND 121 as a function of time. Plot 506 represents PWMout voltage as a function of time. Prior to time 508, the voltage difference between SGND 111 and GND 121 remains substantially consistent at a first voltage level 510 (e.g., −110 volts DC). At time 508, the voltage difference between SGND 111 and GND 121 begins to alternate between the first voltage level 510 and a second voltage level 512 (e.g., +110 volts DC). As shown in the diagram 500, the FIS 122 provides the driver 120 with an improved response to transient ground bounce in as much as PWMout continues to track PWMin, as the voltage difference between SGND 111 and GND 121 swings between the first voltage level 510 and the second voltage level 512.

Figure 6:
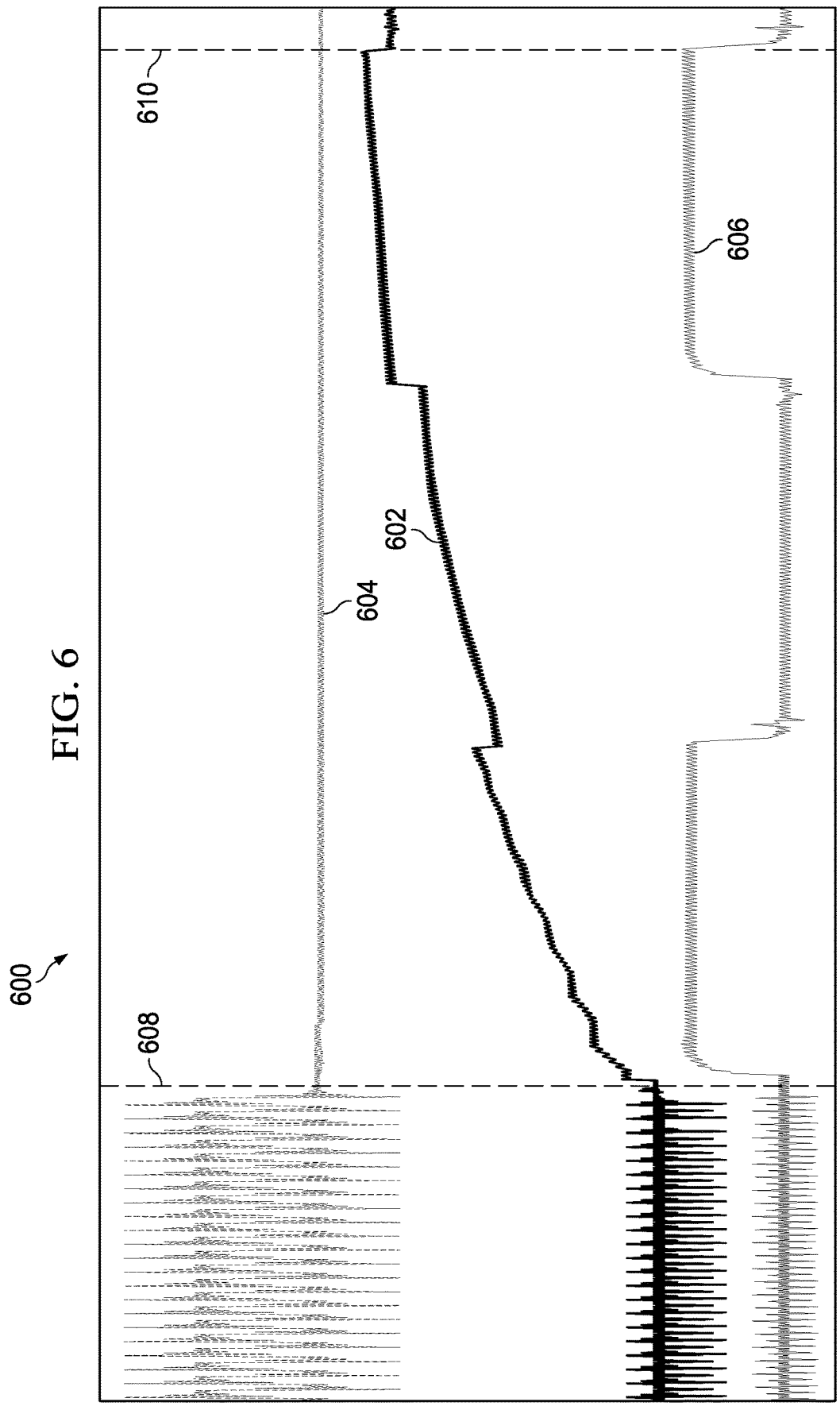
FIG. 6 is a diagram of example measured signal waveforms showing voltage as a function of time.

FIG. 6 is a diagram 600 of example bench measured signal waveforms that show responses by the driver 120 that includes the FIS 122 to transient ground bounce and common mode input shifts. The diagram 600 includes waveforms 602, 604, and 606. Waveform 602 corresponds to voltage difference between SGND 111 and GND 121 as a function of time. Waveform 604 corresponds to PWMin voltage as a function of time provided by the controller 110. Waveform 606 represents PWMout voltage as a function of time. Prior to time 608, the voltage difference between SGND 111 and GND 121 alternates between approximately −40 volts and approximately +90 volts. Between time 608 and time 610, PWMin varies from approximately −31 volts to approximately 0 volts. As shown in the diagram 600, the FIS 122 provides the driver 120 with an improved response to transient ground bounce in as much as PWMout continues to track PWMin, as the voltage difference between SGND 111 and GND 121 alternates between approximately −40 volts and approximately +90 volts. The diagram 600 also shows that the FIS 122 provides the driver 120 with an improved response to common mode input shifts in as much as PWMout remains stable or substantially stable responsive to the driver 120 encountering PWMin volatility (e.g., variations in voltage from approximately −31 volts to approximately 0 volts).

Figure 7:
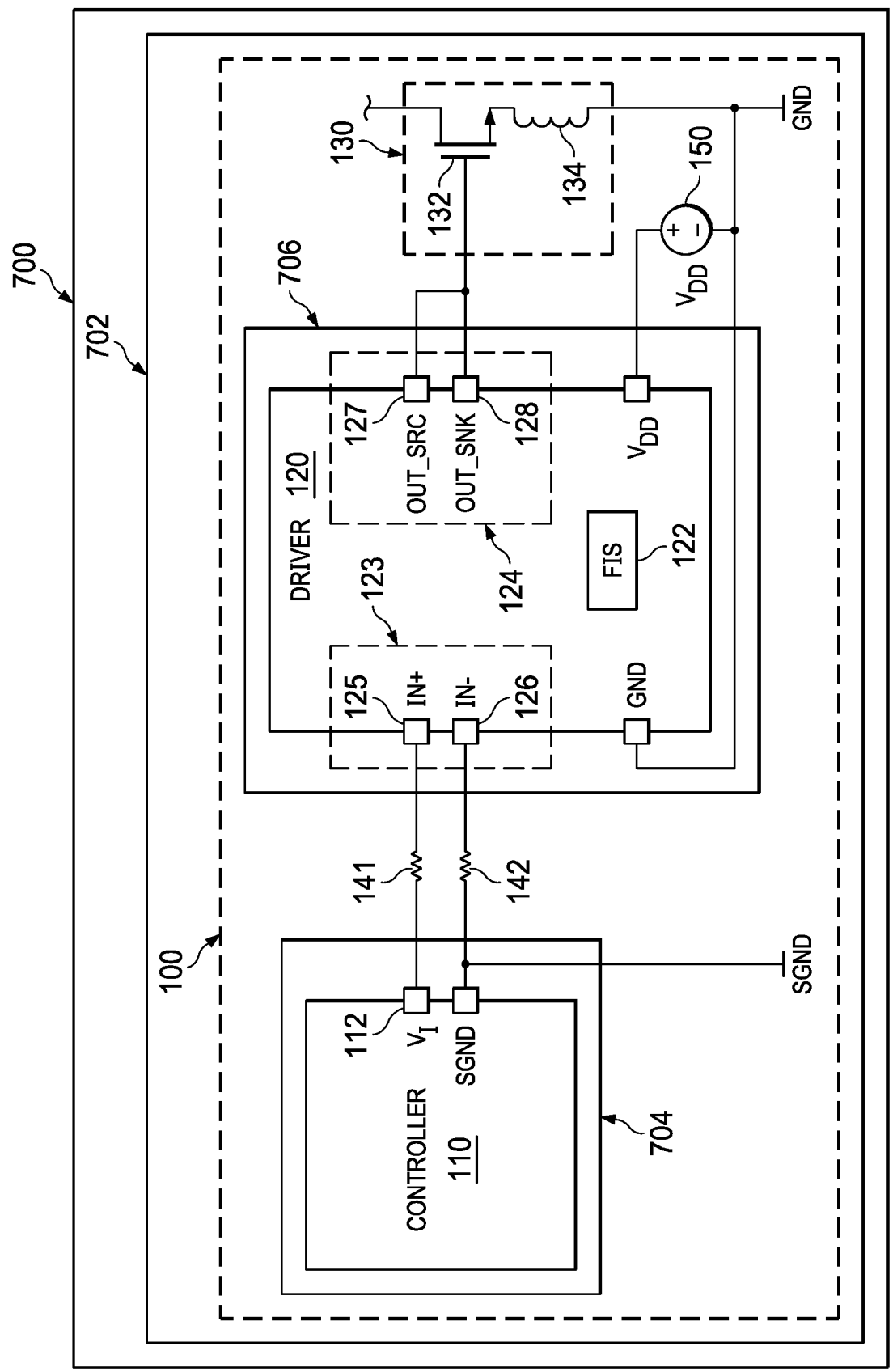
FIG. 7 is a block diagram of an example system that includes the system for driving the load.

FIG. 7 is a block diagram of an example system 700 that includes the system 100 for driving the load 130. At least some implementations of the system 700 are representative of application environments for the system 100, such as an automobile, an appliance, a personal electronic device, or other application environment that implement a system with a driver that includes an FIS. In at least some examples, the system 700 includes a printed circuit board 702 having a first semiconductor package 704 and a second semiconductor package 706. The printed circuit board 702 may include one or more conductors (e.g., traces) that couple load 130, $Rint_1$ 141, $Rint_2$ 142, $V_{DD}$ 150, first semiconductor package 704 and second semiconductor package 706. The first semiconductor package 704 and the second semiconductor package 706 may each include one or more discrete semiconductor devices or integrated circuits that implement controller 110 and driver 120, respectively.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. An apparatus, comprising:
   a differential input pair having a first differential input and a second differential input, wherein the first differential input is adapted to be coupled to an output of a controller and the second differential input is adapted to be coupled to a signal ground terminal;
   a first resistor and a second resistor, wherein the first resistor is adapted to be coupled to a third resistor via the first differential input to form a first voltage divider, and the second resistor is adapted to be coupled to a fourth resistor via the second differential input to form a second voltage divider;
   a comparator having a first comparator input, a second comparator input and a comparator output, wherein the first comparator input is coupled between the first resistor and the first differential input, and the second comparator input is coupled between the second resistor and the second differential input; and
   a transconductance amplifier (TA) having a TA output and a TA input pair that includes a first TA input and a second TA input, wherein the TA output is coupled to the second comparator input, wherein the first TA input is coupled to the first differential input, and the second TA input is coupled to the second differential input.

2. The apparatus of claim 1, further comprising:
   an amplifier having an amplifier input and an amplifier output, wherein the amplifier input is coupled to a device ground terminal, wherein the first differential input and the amplifier output are coupled to opposing ends of the first resistor, and the second differential input and the amplifier output are coupled to opposing ends of the second resistor.

3. The apparatus of claim 2, wherein the amplifier input is a first amplifier input, and the amplifier includes a second amplifier input coupled to the amplifier.

4. The apparatus of claim 2, further comprising:
   a third voltage divider having a fifth resistor coupled to a supply voltage terminal, and a sixth resistor coupled to the device ground terminal, wherein the amplifier input is coupled to the third voltage divider between the fifth and sixth resistors.

5. The apparatus of claim 2, wherein the second resistor is adapted to be coupled between the signal ground terminal and the amplifier output.

6. The apparatus of claim 1, further comprising a deglitch circuit coupled to the comparator output.

7. An apparatus, comprising:
   a differential input pair and a state output, wherein the differential input pair includes a first differential input and a second differential input, wherein the state output is adapted to be coupled to a transistor, wherein the first differential input is adapted to be coupled to an output of a controller, and the second differential input is adapted to be coupled to a signal ground of the controller;
   a comparator having first and second comparator inputs and a comparator output, the first comparator input coupled to the first differential input, the second comparator input coupled to the second differential input, and the comparator output coupled to the state output, wherein the comparator is configured to provide a state signal to the state output responsive to a differential signal present on the differential input pair, and the state signal is configured to set an operational state of a driver; and
   a transconductance amplifier (TA) coupled between the differential input pair and the comparator, wherein the TA is configured to set a reference voltage at an input of the comparator based on the differential signal present on the differential input.

8. The apparatus of claim 7, wherein the reference voltage reduces pulse width distortion in the state signal.

9. The apparatus of claim 7, further comprising:
   an amplifier having an amplifier output configured to provide a direct current (DC) voltage offset with respect to a device ground, wherein the amplifier output is coupled to the first differential input via a first resistor and to the second differential input via a second resistor.

10. The apparatus of claim 9, wherein the DC voltage offset reduces the negative voltage levels at the differential input pair.

11. The apparatus of claim 9, wherein the second resistor is adapted to be coupled to a third resistor via the second differential input to form a voltage divider that is adapted to be coupled between the signal ground terminal and the amplifier output.

12. The apparatus of claim 9, wherein the DC voltage offset reduces variations in the state signal induced by common mode voltage swings between the signal ground terminal and the device ground terminal.

13. A system, comprising:
   a controller having a controller output, the controller configured to provide an input signal at the controller output, the input signal referenced to a signal ground; and
   a driver including:
      a differential input pair and a state output, the differential input pair having a first differential input coupled to the controller output, and a second differential input coupled to the signal ground;
      a first resistor and a second resistor, wherein the first resistor is coupled to a third resistor via the first differential input to form a first voltage divider, wherein the second resistor is coupled to a fourth resistor via the second differential input to form a second voltage divider, and the first and second voltage dividers form a voltage divider network that is configured to provide a differential signal to the differential input pair responsive to the input signal;

a comparator having first and second comparator inputs and a comparator output, the first comparator input coupled to the first differential input, the second comparator input coupled to the second differential input, and the comparator output coupled to the state output, wherein the comparator is configured to provide a state signal to the state output responsive to the differential signal present on the differential input pair, and the state signal is configured to set an operational state of a driver and is referenced to a device ground of the driver; and a transconductance amplifier (TA) coupled between the differential input pair and the comparator, wherein the TA is configured to set a reference voltage at an input of the comparator responsive to the differential signal present on the differential input pair.

14. The system of claim 13, wherein a voltage level of the state signal is higher than a voltage level of the input signal.

15. The system of claim 13, wherein the TA is further configured to dynamically adjust the reference voltage to track voltage variations in the input signal to reduce input-to-output propagation delays between the differential input pair and the state output.

16. The system of claim 13, wherein the driver includes an amplifier coupled to the first differential input via the first resistor and to the second differential input via the second resistor, wherein the amplifier is configured to provide a direct current (DC) voltage offset with respect to the device ground.

17. The system of claim 13, wherein the driver includes a deglitch circuit coupled between the comparator and the state output, and the deglitch circuit is configured to reduce spurious signals within the state signal.

* * * * *